(12) United States Patent
Krishna et al.

(10) Patent No.: US 9,588,155 B2
(45) Date of Patent: Mar. 7, 2017

(54) CURRENT DETECTION CIRCUIT WITH OVER-CURRENT PROTECTION

(71) Applicants: Siddhartha Gopal Krishna, New Delhi (IN); Ramji Gupta, Jhansi (IN)

(72) Inventors: Siddhartha Gopal Krishna, New Delhi (IN); Ramji Gupta, Jhansi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 295 days.

(21) Appl. No.: 14/516,555

(22) Filed: Oct. 16, 2014

(65) Prior Publication Data

US 2016/0109489 A1  Apr. 21, 2016

(51) Int. Cl.
*G01R 31/02* (2006.01)
*G01R 19/165* (2006.01)
*B60R 21/01* (2006.01)

(52) U.S. Cl.
CPC ........ *G01R 19/16571* (2013.01); *B60R 21/01* (2013.01); *B60R 2021/01068* (2013.01)

(58) Field of Classification Search
CPC . G01R 1/06788; G01R 1/06772; G05F 1/573; G05F 1/5735
USPC ................. 324/72, 71.1, 76, 76.11
See application file for complete search history.

(56) References Cited

U.S. PATENT DOCUMENTS

| | | | | |
|---|---|---|---|---|
| 4,403,332 A * | 9/1983 | Weber | ...... | H03K 7/06 340/870.21 |
| 5,296,802 A * | 3/1994 | Beranger | ...... | G01R 15/148 324/117 R |
| 5,487,128 A * | 1/1996 | Ozawa | ...... | H03M 7/3082 704/219 |
| 5,530,712 A * | 6/1996 | Solina | ...... | H04B 10/564 372/31 |
| 5,943,203 A * | 8/1999 | Wang | ...... | H02H 3/07 361/103 |
| 5,995,520 A * | 11/1999 | Uchiki | ...... | H04L 27/22 370/204 |
| 6,452,373 B2 * | 9/2002 | Medelius | ...... | G01R 19/0053 324/102 |

(Continued)

OTHER PUBLICATIONS

DSI Consortium, "Distributed System Interface", http://www.dsiconsortium.org/, Jun. 22, 2010.

(Continued)

*Primary Examiner* — Tung X Nguyen
*Assistant Examiner* — Dominic Hawkins
(74) *Attorney, Agent, or Firm* — Charles E. Bergere

(57) ABSTRACT

Threshold detection for load current on a bus involves generating an output current representative of the load current using a transconductance circuit, sampling the output current during a quiescent phase of the bus to produce a sample current, generating a compensation current that is proportional to the transconductance gain associated with the transconductance circuit, where the compensation current is a function of the sample current, combining the output current, the sample current, the compensation current, and a reference current representative of a threshold value for the load current to produce a combined current, and using a discriminator during an active phase of the bus to output a first value when the sum current exceeds the threshold value and a second value when the combined current is less than the threshold value.

13 Claims, 8 Drawing Sheets

(56) References Cited

U.S. PATENT DOCUMENTS

| | | | | |
|---|---|---|---|---|
| 6,636,319 B1* | 10/2003 | Auth | | G01J 3/453 250/339.07 |
| 6,765,372 B2* | 7/2004 | Isham | | G01R 31/40 323/224 |
| RE40,915 E * | 9/2009 | Isham | | G01R 31/40 323/224 |
| 7,589,514 B1* | 9/2009 | Fernald | | H02M 3/156 324/522 |
| 8,044,644 B2 | 10/2011 | Huang et al. | | |
| 8,122,159 B2 | 2/2012 | Monreal | | |
| 8,675,320 B2 | 3/2014 | Chang et al. | | |
| 8,948,889 B2* | 2/2015 | Manssen | | H04B 1/0458 455/77 |
| 2003/0081292 A1* | 5/2003 | Mikami | | H04B 10/2513 398/147 |
| 2003/0105397 A1* | 6/2003 | Tumer | | G01T 1/2985 600/436 |
| 2009/0316813 A1* | 12/2009 | Kawasaki | | H04L 1/0625 375/260 |
| 2010/0027300 A1* | 2/2010 | Fang | | H02M 3/33507 363/21.16 |
| 2011/0002467 A1* | 1/2011 | Nielsen | | H03G 5/165 381/17 |
| 2011/0095817 A1* | 4/2011 | Yamada | | H03F 1/52 330/98 |
| 2012/0075754 A1* | 3/2012 | Jayanth | | H02H 7/0852 361/26 |
| 2013/0106332 A1* | 5/2013 | Williams | | H02P 21/00 318/400.23 |
| 2013/0163136 A1 | 6/2013 | Chang | | |
| 2013/0271216 A1* | 10/2013 | Liu | | G01R 19/0092 330/254 |
| 2014/0021979 A1 | 1/2014 | Huang | | |
| 2015/0261704 A1* | 9/2015 | Vaccaro | | G06F 13/362 710/114 |
| 2015/0372755 A1* | 12/2015 | Chung | | H04B 10/25133 398/188 |

OTHER PUBLICATIONS

DSI Consortium, "DSI13 Bus Standard Revision 1.00", http://www.dsiconsortium.org/, Feb. 16, 2011.

Abarrilado (The Deltas Blog), "DSI3 vs. PSI5" http://deltas.blog.com/2012/06/08/dsi3-vs-psi5-2/, Jun. 8, 2012.

* cited by examiner

| $I_Q$ (mA) | $I_{LOAD} - I_Q$ (mA) | $I_C + I_{ref}$ WITHOUT COMP (µA) | $I_C + I_{ref}$ WITH COMP (µA) |
|---|---|---|---|
| 4 | 12 | -1.5 | 0.31 |
| 6 | 12 | -1.13 | 0.37 |
| 8 | 12 | -0.75 | 0.42 |
| 10 | 12 | -0.37 | 0.46 |
| 12 | 12 | 0 | 0.48 |
| 14 | 12 | 0.35 | 0.47 |
| 16 | 12 | 0.69 | 0.44 |
| 18 | 12 | 1.04 | 0.41 |
| 20 | 12 | 1.38 | 0.37 |
| 22 | 12 | 1.73 | 0.31 |
| 24 | 12 | 2.07 | 0.24 |

US 9,588,155 B2

CURRENT DETECTION CIRCUIT WITH OVER-CURRENT PROTECTION

BACKGROUND OF THE INVENTION

The present invention relates generally to integrated circuits and, more particularly, to a circuit for detecting a load current on a bus that compensates for non-linearity thereof.

Two-wire (e.g., current loop) communications interfaces are widely used in automotive and industrial applications to minimize wiring and failure points in mission-critical and cost-sensitive applications. One such interface is covered under the Distributed System Interface (version 3) standard (herein "DSI3"), Feb. 16, 2011, incorporated herein by reference in its entirety, see http://www.dsiconsortium.org/downloads/DSI3_%20Bus_Standard_r1.00.pdf. Another such interface standard is known as the Peripheral Sensor Interface for Automotive Applications (version 5) standard (herein "PSI5"), incorporated herein by reference in its entirety, see http://psi5.org/fileadmin/user_upload/01_psi5.org/04_Specification/Specifications_PDFs/psi5_spec_v2d1_base.pdf.

DSI3 is a third-generation slave/satellite interface bus primarily intended for safety-critical communication between a central master interface and multiple satellite nodes, also called slaves. Slave nodes can be implemented as simple state machines or as microprocessor- or DSP-based controllers. The slaves can provide raw data signal sources or pre-processed signal sources. Each slave can contain a single data source or multiple data sources. Slave nodes can also provide output and control functions.

Included within the DSI3 protocol is a Discovery Mode in which slave devices automatically determine their position on a serial daisy-chain bus, and each slave is assigned a unique physical address. The Discovery Mode allows for the unique identification of slaves that may have the same identical features and part number, according to their position on the serial daisy-chain bus. For slaves with unique characteristics, the Discovery Mode can be used to ensure that the device with the correct capability is in the proper location of the serial daisy-chain bus. The primary target application area for the DSI3 network is automotive airbag systems; however, it is anticipated that the new features of the protocol will also allow the use of DSI3 in other application areas.

The DSI3 protocol has been designed to improve upon the capabilities of existing sensor-bus protocols. In particular there are bandwidth improvements, EMC improvements, and data integrity improvements. There are also fundamental changes that allow for reduced cost implementations.

Both DSI3 and PSI5 standards use a two-wire interface to enable the master controller to talk to one or more slave or satellite devices in at least a daisy-chain configuration as illustrated in configuration 100 of FIG. 1.

DSI3 defines a forward channel for master-to-slave communication and a reverse channel for slave-to-master communication. The forward channel uses voltage fluctuations, and the reverse channel uses current fluctuations. DSI3 uses a half-duplex command-and-response transaction model. With the command-and-response transaction model, the master always initiates the communication cycle via a voltage-modulated command, and the addressed slave responds with a current-modulated response.

The physical layer of DSI3 allows for a connection between a single master and one or multiple slaves. The physical-layer interface provides both power and data communication signals.

Per DSI3, as illustrated in FIG. 1, a master 110 and slaves 120(1)-120($n$) share a common ground wire 130, and the master 110 provides a supply voltage $V_Q$ to the slaves 120 less a small voltage drop across the current-sense resistor $R_M$ of the master 110 when the first slave device 120(1) in the daisy chain, and less additional small-voltage drops across the current-sense resistors $R_S$ of the preceding slaves 120 for each subsequent slave.

Using a wire 140, the master 110 may also signal commands to the slaves 120 using changes in supply voltage $V_Q$ that are conveyed (with inconsequential voltage reductions) through small-value (e.g., 2 ohm) series resistors $R_M$ and $R_S$ as applicable, which changes are sufficiently small that they should not compromise the operation of the slave circuits, yet sufficiently large that they should be detectable and decoded by the slaves.

Each command can be uniquely addressed to a specific slave using the address for the slave that is determined during the Discovery Mode phase of the DSI3 protocol. The slaves 120 respond to the master 110 using a current-modulation mechanism that can be detected and decoded by the master 110. For example, the slave 120(1) may be addressed by the master 110 with a voltage-encoded command requesting a sensor value be reported corresponding to a sensor associated with the slave 120(1). The slave 120(1) may respond by modulating its output current, which current modulation would return to the master 110 on the common return wire 130, where it may be sensed and decoded by the master 110.

An important part of the DSI3 standard is the DSI3 address Discovery Mode (DM) protocol. The DM protocol starts after power is applied, with all of the slaves 120 setting an internal address counter to binary "1." The master 110 then transmits a unique Discover command via voltage modulation. After a specified time, all of the slaves 120 enter a mode where they start to reply to the master 110 by inserting additional current into the loop (above and beyond any quiescent current they may already be drawing). For example, the slave 120(1) may start to reply to the master 110's command by inserting a reply current into the loop ($I_{REPLY}$) using its internal current source 160.

In DSI3, reply currents are inserted at one of two levels as part of a two-level logic system. The first level is called $I_{RESP}$, and it can vary from 10.5 to 13.5 mA. The second level is called $2*I_{RESP}$, and it can vary from 21 to 27 mA. The appropriate reply current to a DM command is $2*I_{RESP}$.

Note that a reply current inserted by the current source 160 of the slave 120(1) returns directly to the master 110 via the common wire 130. It is thus not part of any output current from the slave 120(1) that would be carried by a wire 150 between the first and second slaves 120(1) and 120(2). It is similarly not sensed as part of the output load current seen by the slave 120(1). Further, the reply current from the slave 120(1) similarly does not contribute to any load current seen by the slaves 120(2)-120($n$) that are downstream of the slave 120(1) in the daisy chain.

On the other hand, a reply current inserted into the current loop by the slave 120(2) would be an incremental part of the load current that passes through a sense resistor 180 of the slave 120(1), and is thus detectable by the slave 120(1), but it would not, for example, be part of the load current seen by slaves downstream of the slave 120(1) (including slave 120(2) itself).

During Discovery Mode, each of the slaves 120 monitors the load current that passes through its sense resistor $R_S$. There are two different situations that a slave may encounter based on its position in the daisy chain.

(1) Last Slave—If, during DM, a slave does not detect additional load current through its sense resistor (i.e., additional current being drawn by one or more downstream slaves that is approaching a 2*$I_{RESP}$ level that is above the cumulative quiescent current of the downstream slaves), it then logically concludes that it is the last device in the daisy chain, and it sets its address register to the current value of the address counter (which would be equal to 1 if this is the first time through this process after power is applied). After a specified time, each slave deactivates its reply current and does not re-activate it until the current Discovery cycle has completed.

(2) Other Than Last Slave—If a slave does detect additional load current through its sense resistor (above the cumulative quiescent current it sees during periods of inactivity on the bus), it then recognizes that it is not the last slave in the daisy chain, so it immediately deactivates its reply current and increments its address counter.

Following steps (1) and (2) above, the Discovery command is reissued, and steps (1) and (2) are repeated until all slaves have accepted an address. For example, for n=3 in exemplary system 100 of FIG. 1, the discovery phase would require 3 cycles to complete, and, at its end, slave 120(3) will have address 1, slave 120(2) will have address 2, and slave 120(1) will have address 3.

In principle, the implementation of the discovery protocol is straightforward. However, in practice, the load current at the output of a slave device that is close to the master in the daisy chain (e.g., the current in the wire 150 of the slave 120(1) of FIG. 1) can differ significantly from the load current output from a slave device that is further down the daisy chain.

For example, even when all of the slaves 120 are dormant (i.e., no slave is supplying reply current), a first slave in an n-slave network will see a load current $I_{LOAD}$ that is n times greater than the load current seen by the last slave in the daisy chain. When no slaves are replying to the master 110, the load current seen by the first slave 120(1) is the sum of quiescent currents of all of the slaves that are further down the daisy chain than the first slave. If a single slave is replying somewhere further down the chain, the first slave will see an $I_{LOAD}$ that additionally includes $I_{RESP}$ or 2*$I_{RESP}$ of that single slave.

In a typical DSI3 implementation, the individual quiescent current of a slave $I_{q\_slave}$ may vary from 8 to 12 mA, but the total static quiescent bus loading of n slaves may be between 2 mA and 38 to 42 mA max. The reply current associated with a Discovery command from a single slave is from 21 to 27 mA (for a reply equal to 2*$I_{RESP}$) and can constitute a significant part of the load current seen at a slave. Thus, the total load current seen at a slave, such as slave 120(1) of FIG. 1, can vary between roughly 8 and 69 mA. In a DSI3 DM implementation, a slave will typically shut itself down when it sees a load current of $I_{RESP}$ above the quiescent load current.

In general, the transconductance of a current detector in the slave is non-linear across such large variations in $I_{LOAD}$ based on the effect of $I_{LOAD}$ on the operating point of circuitry utilized within the slave device. This non-linearity in long daisy chains of devices, in the presence of electronic noise that is typical of the implementation environment for DSI3 and related protocols, can lead to errors in the execution of the discovery protocol and other slave current-response signaling. Such errors are unacceptable in the typical application spaces of these protocols, which include, for example, safety-restraint systems and airbag-control systems in automobiles. Thus, methods are crucially needed to reduce non-linearity in the circuits used to implement slave devices.

BRIEF DESCRIPTION OF THE DRAWINGS

The present invention is illustrated by way of example and is not limited by the accompanying figures, in which like references indicate similar elements.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
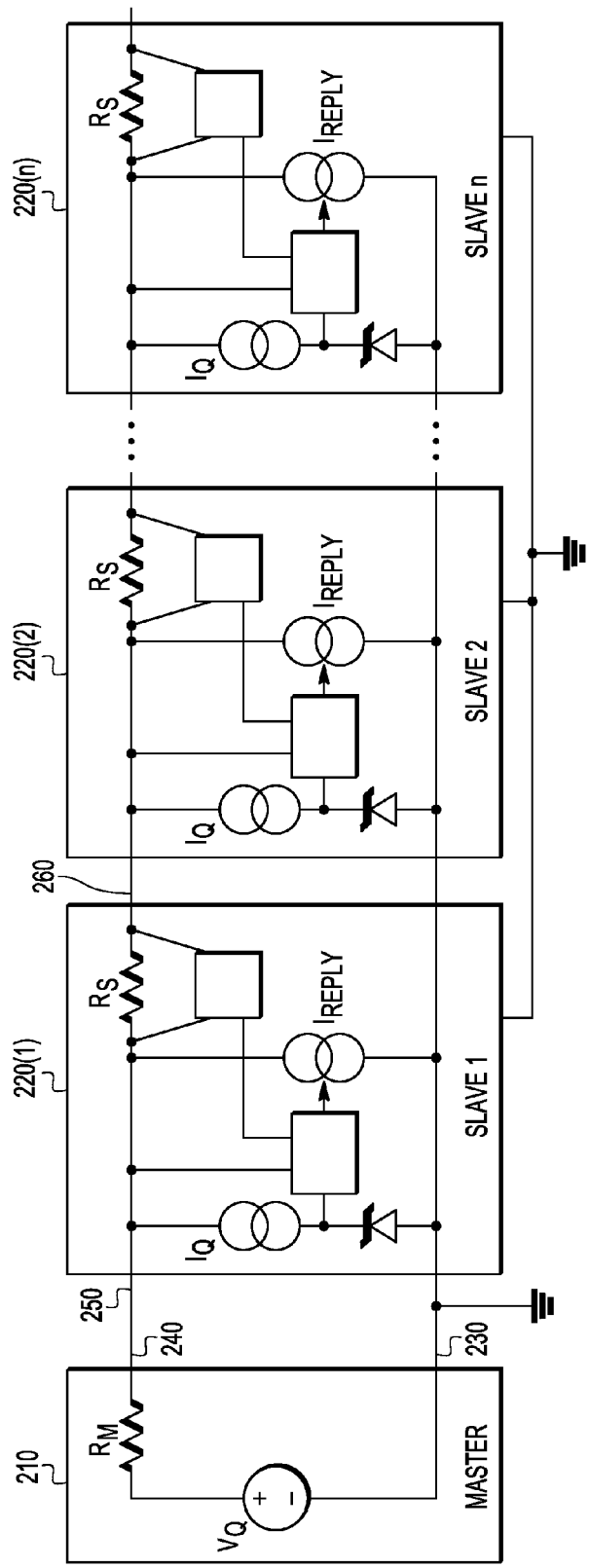
FIG. 2 is a schematic block diagram illustrating a daisy-chain interconnect between a master and multiple slaves, according to an exemplary embodiment of the present invention.

Referring now to FIG. 2, a daisy-chain interconnect 200 between a master 210 and multiple slaves 220(1)-220(n), according to an embodiment of the present invention, is shown. The slaves 220 are connected to the master 210 in a daisy-chain fashion.

In particular, the master 210 includes a two-wire interface comprising a ground wire 230 and a power/command wire 240. Each slave 220(i) includes an input wire, an output wire, and a ground wire. For example, the slave 220(1) includes an input wire 250, an output wire 260, and the ground wire 230. The ground wires 230 of the master 210 and the slaves 220 are all tied together. As can be seen, the output of the slave 220(1) is connected to the input of the slave 220(2), and so on with the output of the slave n-1 (not shown) being connected to the input of the slave n, forming a cascade or daisy chain between them.

Figure 3:
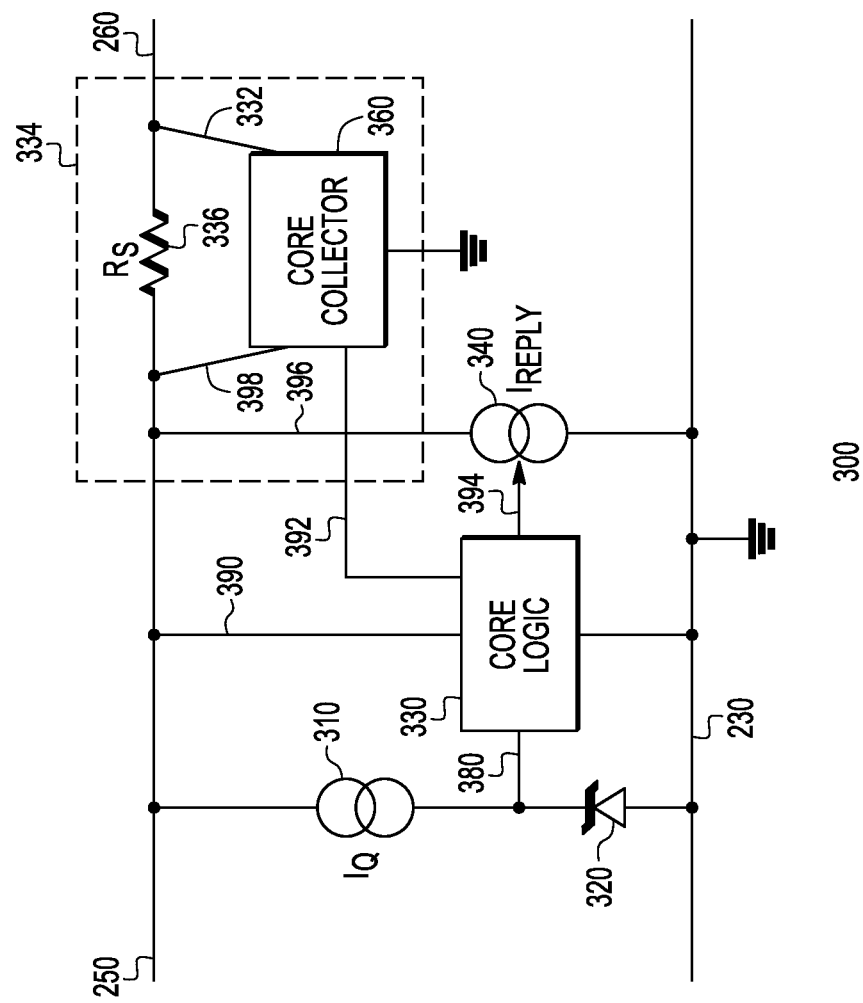
FIG. 3 is a schematic block diagram illustrating a model of an implementation of the internal structure of a slave of FIG. 2, according to an exemplary embodiment of the present invention.

FIG. 3 is a schematic block diagram of an embodiment 300 of the internal circuitry of the slave 220(1) of FIG. 2 according to the present invention. Note that, for those elements of slaves 220(1) to 220(n) that are of importance to this discussion, for all intents and purposes, all of the slaves 220 can be understood to be structurally and functionally similar. However, this discussion focuses on the slave 220(1) so specific contextual references can be made that can aid in conveying a clear description of the invention.

The slave 220(1) includes quiescent current source 310, Zener diode 320, core logic 330, reply current source 340, sense resistor 336, and core detector circuit 360. The quiescent current source 310 represents all current drawn by the circuitry of the slave 220(1) when it is idle. The reply current source 340 represents reply current injected by a slave into the loop (i.e., returned via the ground wire 230 to the master) when the slave is actively responding (typically at an $I_{RESP}$ or $2*I_{RESP}$ level). The core logic 330 represents the functional circuitry of the slave (e.g., sensor and control for airbag or other safety feature of an automobile) as well as the logic of the slave for participating in the addressing protocol, e.g., for address determination during Discovery Mode operation per the DSI3 specification. Finally, the core detector 360 provides detection of the reply current sourced by the reply current source 340 based in part on measurement of the current sensed flowing through sense resistor 336 that is representative of the load current seen at the output of the slave 220(1) and flowing through the output wire 260.

As will be understood to one skilled in the art, the slave 220(1) receives its power and ground via the input wire 250 and the ground wire 230, respectively. Further, the total of all current flowing into the slave 220(1) is equal to the total of all current flowing out of slave the 220(1).

For example, in a first case, if (a) the slave 220(1) is the last slave in the daisy chain and (b) the slave 220(1) is idle, then (1) the current flowing out of the output wire 260 will be zero (since there are no downstream slaves to draw current through the output wire 260) and (2) the current flowing into the slave 220(1) via the input wire 250 will equal the quiescent current $I_{Q\text{-}slave}$ drawn by the slave 220(1), which current will return to ground via the ground wire 230.

In a second case, if (a) the slave 220(1) is the last slave in the daisy chain and (b) the slave 220(1) is active and asserts a reply via the reply current source 340 equal to $2*I_{RESP}$, then the total current into the slave 220(1) via the input wire 250 will equal $I_{q\text{-}slave}+2*I_{RESP}$. Note that, in either the first or second case, no current flows out of the slave 220(1) (i.e., out of the output wire 260), and thus correspondingly no current flows through the sense resistor 336 (i.e., $I_{LOAD}$ for the slave 220(1) is zero in these cases).

In a third case, if the slave 220(1) is not the last slave in the daisy chain, then the current that flows through the sense resistor 336 (also known at the load current $I_{LOAD}$ of the slave 220(1)) is equal to the sum of all currents drawn by idle and active slaves further downstream from the slave 220(1). For example, if one slave that is downstream from the slave 220(1) (e.g., 220(2)) is in a "case two" state as described previously with respect to the slave 220(1), then the load current seen by the slave 220(1) (i.e., the current drawn through sense resistor 336 and flowing out of the output wire 260 to the downstream slave would equal $I_{q\text{-}slave}(220(2))+2*I_{RESP}(220(2))$. In this third case, the current flowing into the slave 220(1) through the input wire 250 would be equal to $I_{q\text{-}slave}(220(1))+I_{q\text{-}slave}(220(2))+4*I_{RESP}$. Note that, in practice, no two slaves will reply concurrently, and the total current draw will not equal $4*I_{RESP}$ since, when a first slave senses a slave that is downstream replying, it backs off its own reply as is described with respect to the DSI3 DM protocol.

The input wire 250 supplies both power and current to the circuit 300. Power and current are provided by the input wire 250 to the circuitry of the slave 220(1). In particular, some of the input current supplied via the input wire 250 is drawn by the quiescent current source 310, which represents the total quiescent draw of the slave 220(1) when it is idle. Note that the output of the quiescent current source 310 is depicted as connected to only the core logic 330, but, in practice, it should be understand to represent all current sunk by the slave 220(1) when the slave 220(1) is idle.

Although some current in reality may be drawn by wire segment 390, wire segment 390 is primarily included in the model to depict that input wire 250 supplies a supply voltage to core logic 330 as it does similarly to circuitry of reply-current source 340 via wire segment 396, and additionally to core 360 via wire segment 398. Finally, control wire 392 provides an indicator from Core Detector 360 to Core Logic 330 as to whether a reply has been detected downstream from the current slave.

Figure 1:
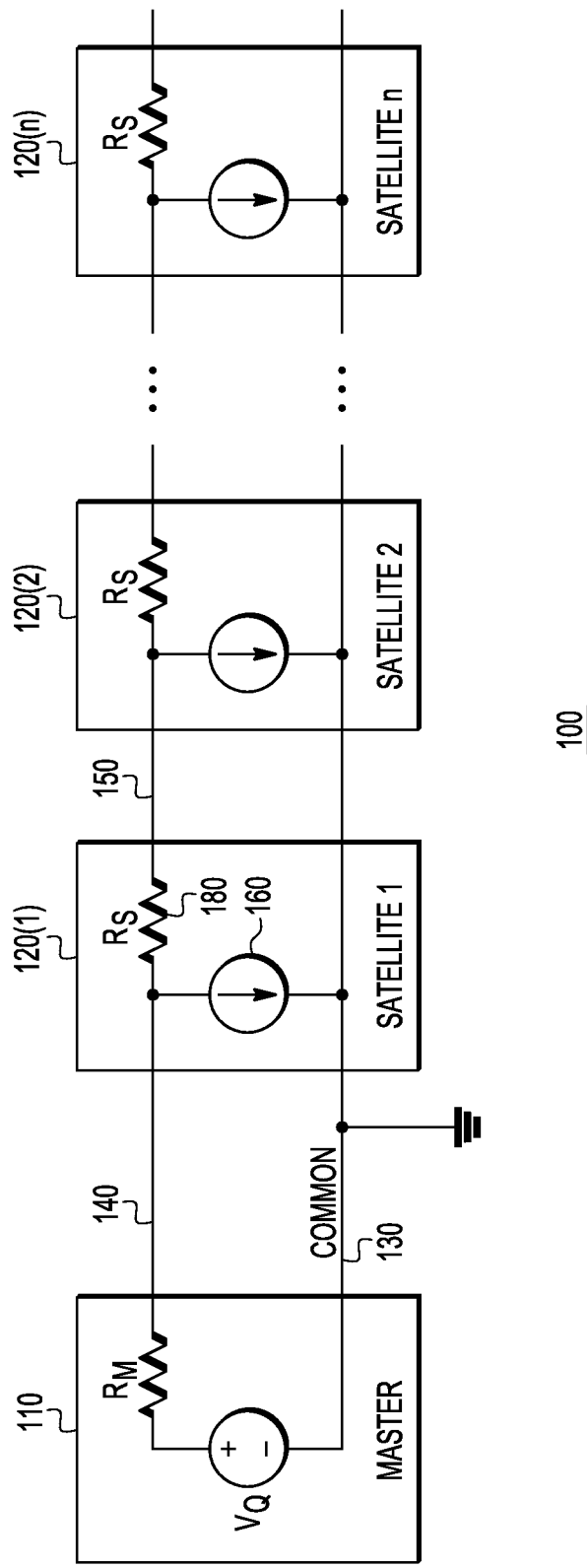
FIG. 1 is a schematic block diagram illustrating a conventional daisy-chain interconnect between a master and multiple slaves per the DSI3 standard.
Figure 4:
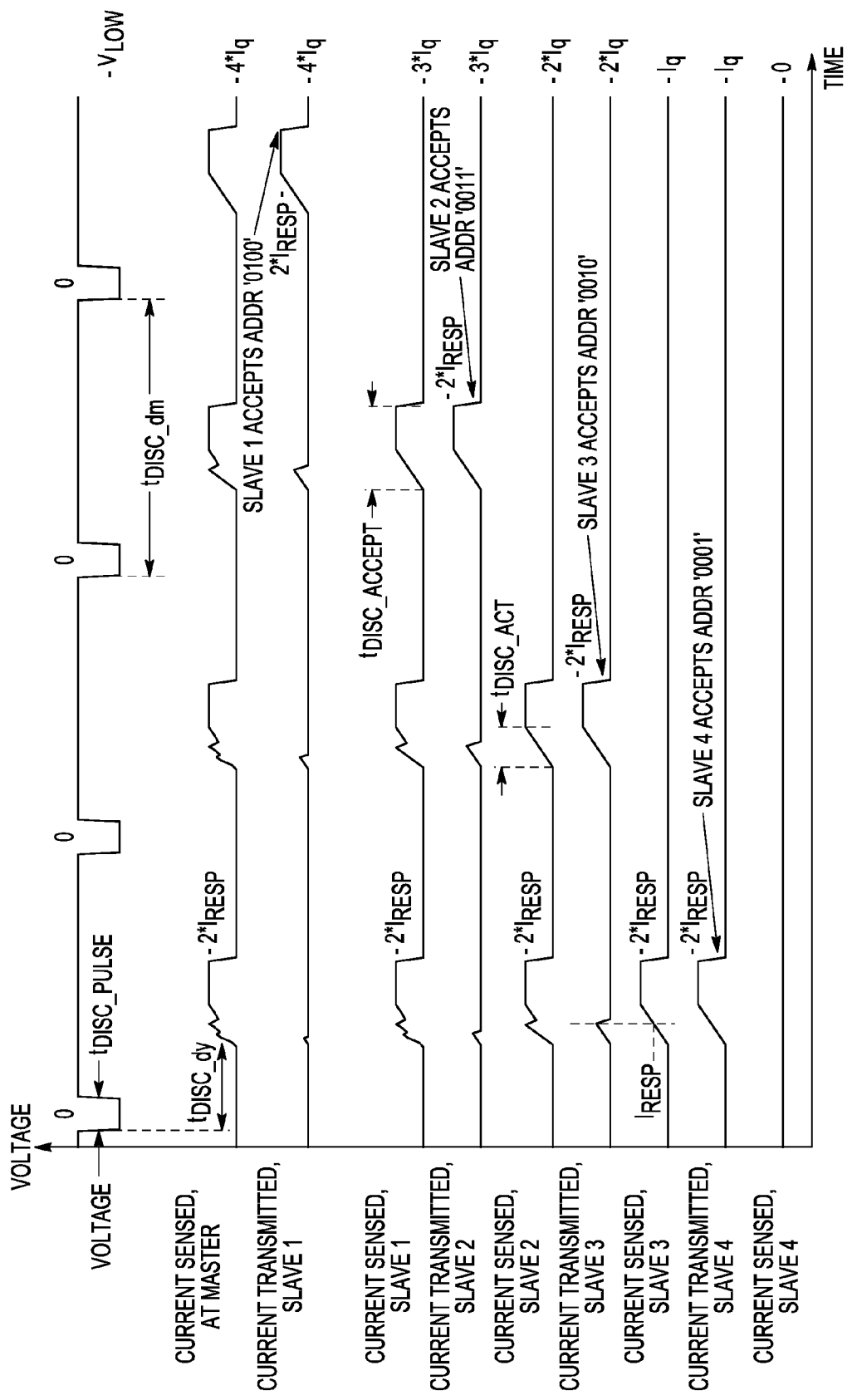
FIG. 4 is a graph illustrating representative timing and magnitude of commands and replies between master and slaves during a DM sequence according to the DSI3 specification and an exemplary embodiment of the present invention.

FIG. 4 illustrates bus activity 400 for a four-slave daisy chain during an exemplary discovery protocol according to an embodiment of the present invention. The diagram is taken directly from the DSI3 specification ("FIG. 6-1: Discovery Mode Example for a 4 Device Bus Segment") and while the present invention is not limited to this specific signaling or timing, the diagram and discussion from the DSI3 specification are helpful in illustrating a context of operation for this embodiment. Since the diagram is explained in the specification, it will not be described in full detail other than to point out how the current sensed at a given slave may include the cumulative quiescent currents of all the slaves that are downstream of that given slave, and, during Discovery Mode, each slave starts a reply to the discovery protocol only to shut its reply off if it detects a reply being sent by a slave that is downstream of it, i.e., $I_{LOAD}$ reaching $I_{RESP}$ above its typical idle-time cumulative downstream quiescent-current value.

As illustrated, for example, note that during the first cycle of a DSI3 Discovery Mode, each of slaves 1-3 detects the current that is being added to its sense resistor by downstream slaves as all slaves ramp their reply current toward $2*I_{RESP}$. When that incremental load current reaches a threshold of $I_{RESP}$ at a particular slave, that particular slave cuts off its own reply current. This threshold is reached relatively quickly at slaves 1-3, each of which then cuts off its reply current. However, slave 4, being the last slave, sees no current ($I_{LOAD}$) through its sense resistor so it continues to ramp its own reply current until it reaches a reply current of $2*I_{RESP}$.

Slave 1 sees the downstream slaves' replies as a load current through its sense resistor ramping from 3*Iq to 2*$I_{RESP}$ above 3*Iq, where Iq is assumed to be the same quiescent current drawn by each of slaves 2-4. Slave 2 sees this as 2*$I_{RESP}$ above 2*Iq, slave 3 sees an $I_{LOAD}$ of 2*$I_{RESP}$ above 1*Iq and slave 4 sees an $I_{LOAD}$ of zero.

Once a slave has transmitted its reply and set its address, it goes idle until all the slaves have their addresses assigned. Note that FIG. 6-1 of the DSI3 specification makes the simplifying assumptions that the quiescent current of each slave is identical and that a response current (or twice its value) can accurately be output from a slave. This is not necessarily the case, particularly with large variances in load current.

Figure 5:
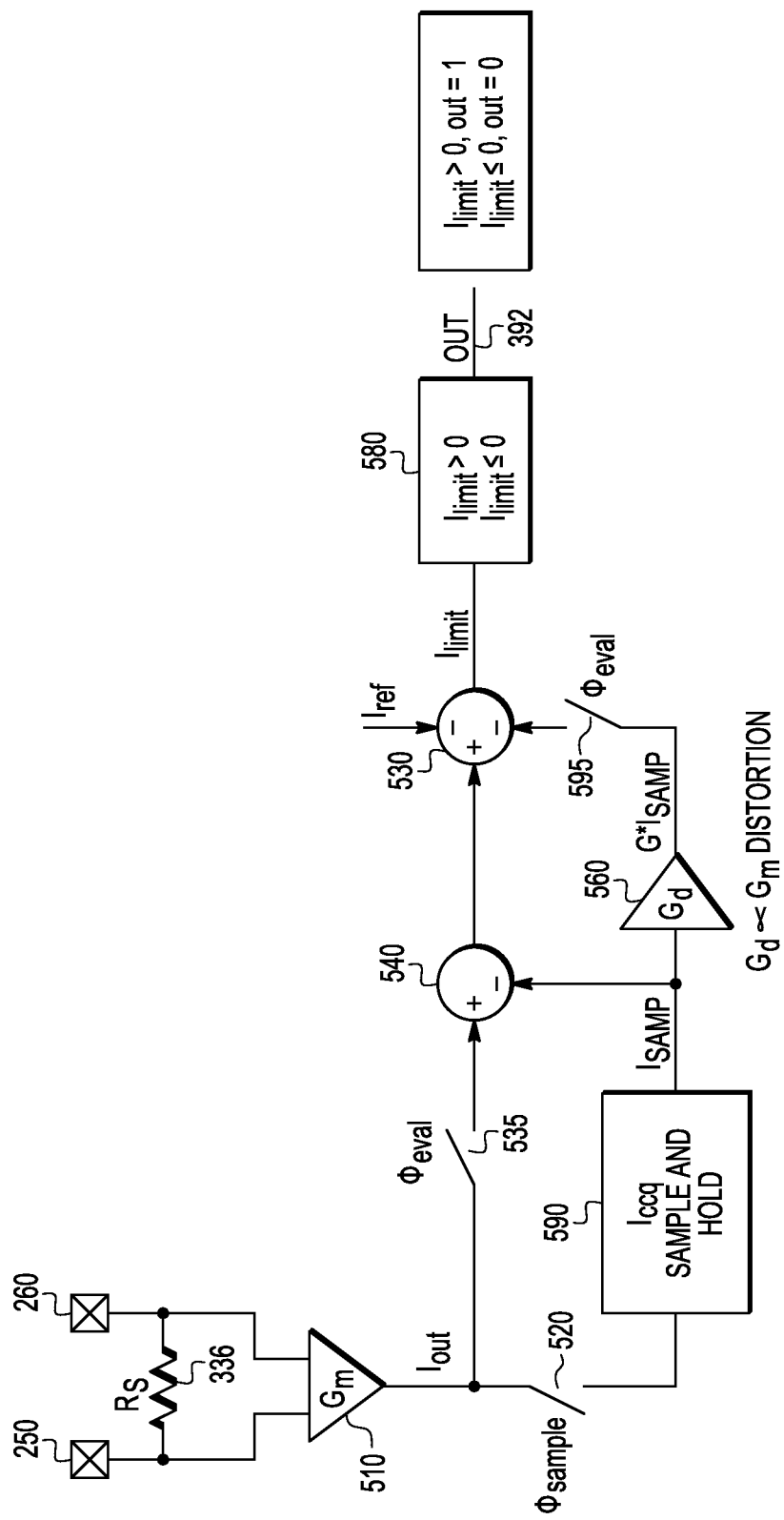
FIG. 5 is a schematic block diagram illustrating a detection circuit according to one embodiment of the present invention.

FIG. 5 depicts a schematic block diagram of one possible embodiment of detector circuit 334 of FIG. 3. In particular, FIG. 5 presents an embodiment of the core detector circuit of FIG. 3 in the context of surrounding circuitry where corresponding components have corresponding labels.

As shown, detector circuit 334 includes transconductance amplifier 510, sample switch 520, evaluation switch 535 and 595, sample-and-hold circuit 590, sample combining circuit 540, sample compensating amplifier 560, reference three-way combining circuit 530, and threshold discriminator 580.

In operation, transconductance amplifier 510 senses the voltage drop across sense resistor 336 due to the current load of downstream slaves and translates the voltage to a proportional representative current $I_{out}$. For example, a 20 mA load current may be translated to a 20 uA $I_{out}$. During a slave idle period when the load current drawn through sense resistor 336 is equal to the sum of quiescent currents of slaves downstream on the daisy chain from slave 220(1), sample switch 520 is closed (while evaluation switches 535 and 595 are open) and sample-and-hold circuit 590 is used to sample $I_{out}$. In this way, sample-and-hold circuit 590 stores a snapshot representative of the idle-time quiescent current drawn by the downstream slaves through sense resistor 336.

Later, for example during an active reply period to a DM command, sample switch 520 is opened, and evaluation switches 535 and 595 are closed. When this happens, the previously sampled and held value of the sum representative of the downstream quiescent currents is subtracted at combining circuit 540 from the present value of $I_{out}$, which value continues to ramp up in time as at least one of the downstream slaves starts to reply to the DM query.

At this point, the output of combining circuit 540 could be compared with the threshold reference current $I_{ref}$, which reference current is typically set to a value representative of $I_{RESP}$, and a zero-crossing discriminator, such as discriminator 580, may be used to determine whether the load current through the sense resistor exceeds $I_{RESP}$.

However, because of the wide range of voltage drops possible across sense resistor 336 with varying load current, transconductance amplifier 510 will typically operate over a wide range, and its current output $I_{out}$ might not be a linear representation of the voltage drop across its input terminals 250 and 260. In particular, the transconductance gain Gm of amplifier 510 may be proportional to the voltage drop across sense resistor 336 (since it may correspond to the gate-to-source voltage $V_{gs}$ of the differential pair of transistors that comprise transconductance amplifier 510.

For example, in a circuit of this type, when $I_q$ is set to 4 mA, $I_{out}$ will be approximately 4 uA, but when $I_q$ is increased to 16 mA, due to non-linearity, $I_{out}$ may typically be observed to 17 uA (instead of 16 uA as would be expected from a system that was linear). Thus, given an $I_q$ of 4 mA, $I_{samp}$ will be held at a value of 4 uA. If a slave then subsequently issues a downstream 12 mA response, $I_{LOAD}$ will increase to 16 mA, and $I_{out}$ will equal 17 uA. When $I_{samp}$ is subtracted from $I_{out}$ as part of the detection process, the result is 17 uA−4 uA=13 uA, instead of an expected 12 uA. This is 1 uA more than expected, representing a full 25% of the sample current of 4 uA.

Similarly, a load current of 10 mA may result in an output current of 10.5 uA and a load current of 22 mA may result in an output current of 25.125 uA for typical transconductance circuits. This non-linearity may make it difficult to select a single reference current that can be used in the detection process consistently and reliably. Because this non-linearity may cause errors in the detection process, it is preferably minimized in various embodiments of this invention. Further compensation may correct for this nonlinearity. In particular then, during the active reply mode, the sample of $I_{out}$ that is held by sample-and-hold circuit 590 is amplified by compensating amplifier 560 with a gain $G_d$ that is proportional to the distortion seem by transconductance amplifier 510 as the distortion changes with different quiescent-current load values through sense resistor 336. For example, with a downstream current $I_q$ of 20 mA, $I_{out}$ may be 20 uA and $G_d*I_{out}$ may be 4 uA. The compensated sample (e.g., 4 uA) that is output from sample-compensating amplifier 560 is then subtracted (from the current output from combining circuit 540) at reference three-way combining circuit 530.

The output of combining circuit 530 is then compared with zero at discriminator 580. The output of discriminator 580 yields a Boolean OUT signal (392) equal to a logical 1 if the output current $I_{limit}$ of combining circuit 530 is greater than zero, or an a Boolean OUT signal equal to a logical 0 if the output $I_{limit}$ of combining circuit 530 is less than or equal to zero.

This logic 1 or 0 output is then utilized by the Core Logic of slave 220(1) in making a determination as to whether or not to output a reply current in response to a master DM command. If OUT==1, then $I_{out}$ has exceeded the reference threshold, indicating a downstream slave is responding, and slave 220(1) shuts down its reply. If OUT==0, then $I_{out}$ is less than the reference threshold, and no downstream slave is replying or it has not yet been determined whether a downstream slave is replying. In this case, slave 220(1) continues to ramp its output reply current toward 2*$I_{RESP}$.

Figure 6:
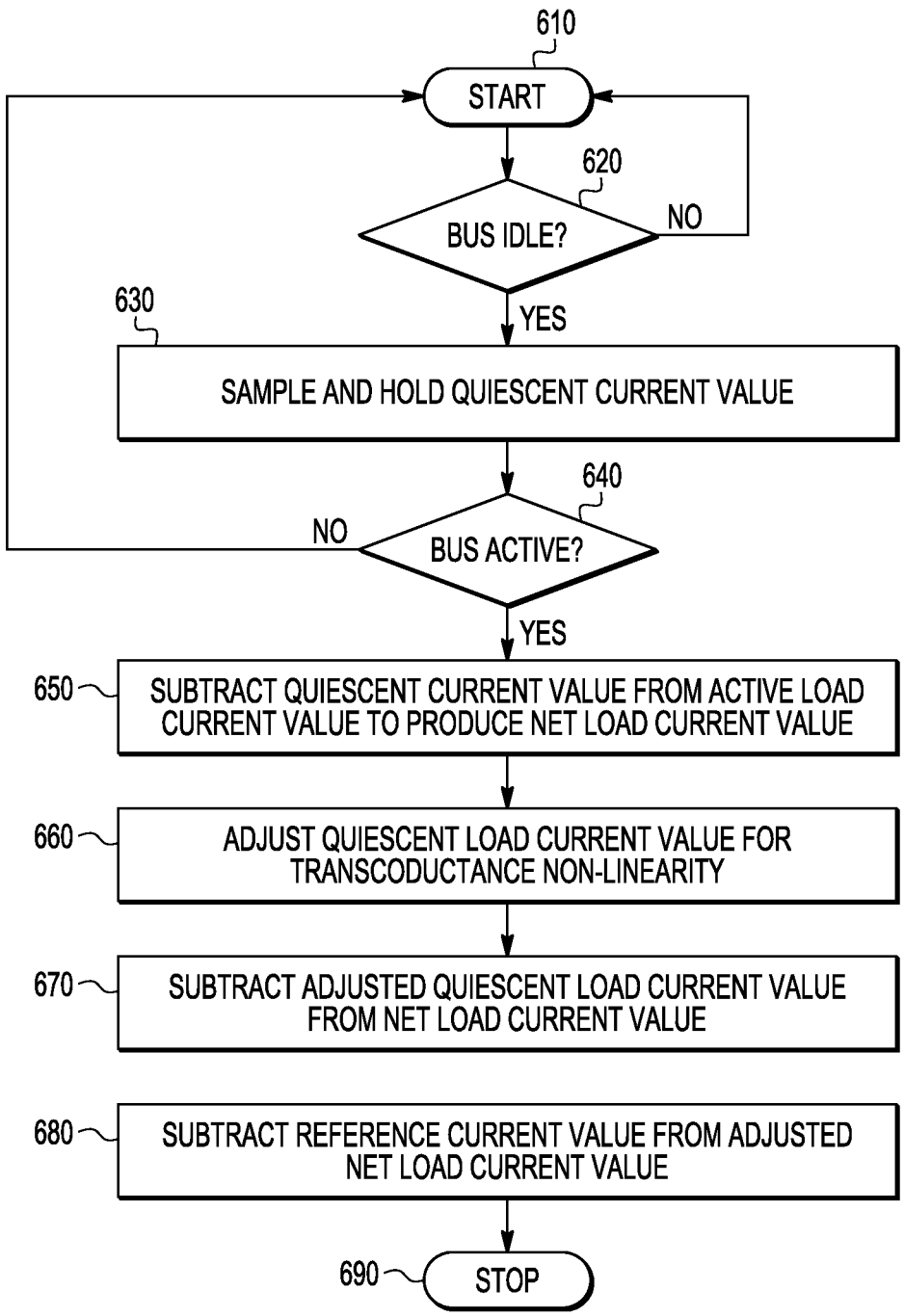
FIG. 6 is a flow chart illustrating a portion of a detection process according to an embodiment of the present invention.

FIG. 6 includes flowchart 600 illustrating one possible method of implementing a portion of the processing of detector circuit 334 of FIG. 3. The method is invoked by the core logic of a slave when it begins an operation requiring detection. For example, the method may begin when a slave receives a DM command from a master, and the method may be called multiple times during a DM cycle to determine whether a threshold of load current has been reached. In various embodiments, portions of the method may be exercised prior to an operation requiring detection. For example, a goal of sampling and holding of the current is to capture the quiescent current component of the load current, it is of interest to sample the load current when no devices are actively replying on the bus. This may best be achieved just prior to the issuance of a DM command or just after the issuance and before any slaves have begun to reply, this period being considered an "inactive" or "quiescent" period on the bus (at least from a reply current perspective).

Once invoked, the method starts in step 610. Next, in step 620, a test is performed to determine whether the bus is idle (i.e., no downstream slaves are providing a reply on the bus to a master command). If the bus is not idle, then flow returns to start step 610. If the bus is idle, then, in step 630, a sample is taken and held whose value is representative of the quiescent downstream of slave 220(1).

For example, as illustrated in FIG. 5, transconductance amplifier 510 may be used to sense the voltage drop across sense resistor 336, producing current $I_{out}$ that is representative of the current flowing through sense resistor 336. Switch 520 is closed in this case, switch 535 is open, and $I_{out}$ is then sampled and held by sample-and-hold circuit 590.

Continuing with the flow chart of FIG. 6, in step 640, a test is performed to determine if the bus is active. If in step 640, the bus is determined to be inactive (e.g., the slave is no longer in a detection mode or an interrupt has been received from a core logic unit of the slave indicating detection is no longer required), then flow returns to start step 610. If, however, in step 640, the bus is determined to be active, then, in step 650, the quiescent-current value that was sampled and held in step 630 is subtracted from the active load current value to produce a net load current value.

For example, as illustrated by FIG. 5, when the bus is active, switch 535 is closed, and switch 520 is open. In this case, current $I_{out}$ out of transconductance amplifier 510, whose value is representative of the present active load current through sense resistor 336 from downstream slaves, flows to combining circuit 540. Additionally, the value that was held by sample-and-hold circuit 590, which value is representative of the quiescent current that was being drawn on the bus by slaves downstream of slave 220(1) when the bus was idle, is subtracted from $I_{out}$ by combining circuit 540 to produce a net load-current value.

Referring back to FIG. 6, in step 660, the load-current value that was sampled and held in step 630 is adjusted for non-linearity that may occur in the transconductance amplification and related circuitry due to the large variance in quiescent-current level as a function of how far up or downstream 220(1) is with respect to other slaves in the daisy chain. For example, as illustrated in FIG. 5, the value that was sampled and held by sample-and-hold circuit 590 may be amplified by distortion-compensating amplifier 560 with gain $G_d$ to adjust for non-linearity.

In step 670 of FIG. 6, the adjusted quiescent load-current value is subtracted from the net load current value. For example, in FIG. 5, during an active phase of the bus, switches 535 and 595 are closed, and the output of distortion-compensating amplifier 560 (that is representative of the quiescent current on the network adjusted for non-linearity) is fed to three-way combining circuit 530, where the output is subtracted from the net load-current value that is output from combining circuit 540.

In step 680 of FIG. 6, a reference-current value is subtracted from the adjusted net load-current value. For example, in FIG. 5, as would be understood to one skilled in the art, three-way combining circuit 530 may be implemented as two cascaded two-way combining circuits, the first subtracting the output of distortion-compensating amplifier 560 from the output of combining circuit 540 to form a first output, and the second subtracting $I_{ref}$ from the first output.

In an implementation of a DSI3 protocol DM solution using the present invention, $I_{ref}$ may be set to a value representative of a load current equal to $I_{RESP}$ (e.g., $I_{ref}$ may be set to $1/G_m$ of $I_{RESP}$, and the result of process 600 of FIG. 6 and similarly the output of three-way combining circuit 530 of FIG. 5 would be greater than zero when the bus load downstream of slave 220 exceeded $I_{RESP}$, indicating that a downstream slave was replying to the master. In this case, a discriminator, e.g., discriminator 580 of FIG. 5, would detect this zero value and output a logic 1 to, for example, a core logic circuit for the slave, such as core logic circuit 330 of slave 220(1), which core logic would control reply-current generator 340 to shut down any reply current that it may have started to send. In step 690 the process completes.

Figure 7:
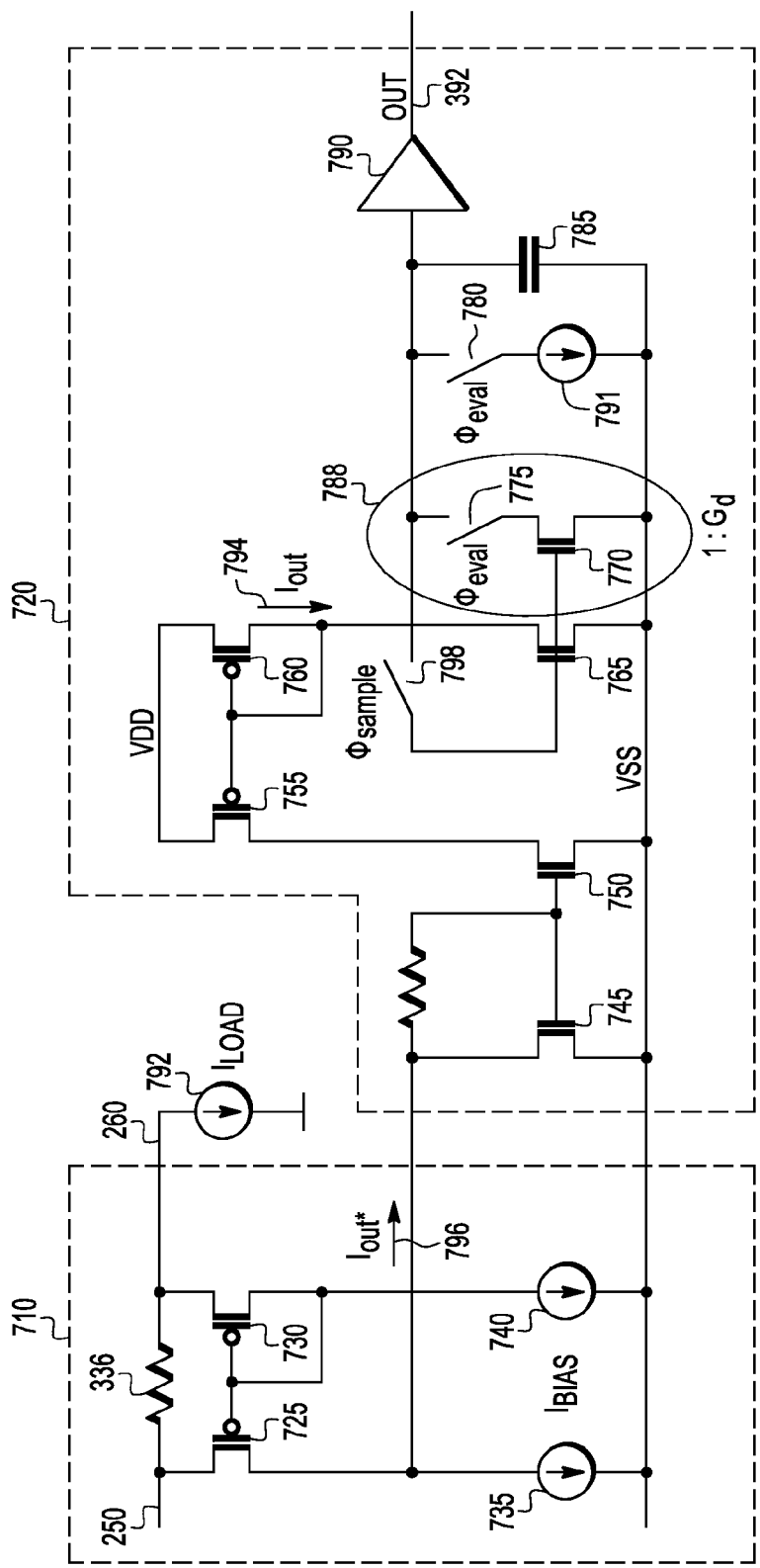
FIG. 7 is a schematic circuit diagram illustrating a detection circuit according to an embodiment of the present invention.

FIG. 7 shows a schematic circuit diagram depicting one possible implementation of detection circuit 334 of FIG. 3 according to the present invention.

FIG. 7 includes sense circuit 710 and sample, subtract, adjust, and discriminate (SSAD) circuit 720. FIG. 7 also includes slave input wire 250, slave output wire 260 and slave sense resistor 336.

Sense circuit 710 includes MOSFET transistors 725 and 730 differentially paired in a transconductance amplifier configuration with sense resistor 336 between their sources. In this configuration, the voltage drop across sense resistor 336 due to the downstream load current 792 that runs through resistor 336 is converted by the transconductance amplifier configuration to a current $I_{out*}$, which is representative of the magnitude of the load current, as a function of the transconductance gain ($G_m$) of the transconductance amplifier configuration. Further, bias-current sources 735 and 740 may be adjusted to bias MOSFETs 725 and 730 in such a way that transconductance gain $G_m$ of the MOSFET configuration is constant across transistor and resistor process and temperature variations.

MOSFET 745 and MOSFET 750 are connected to form a current mirror. In particular, the current 796 ($I_{out*}$) that is representative of the magnitude of load current ($I_{load}$) drawn by slaves downstream of slave 220(1), is drawn through from drain to source of MOSFET 745. This same amount of current is then mirrored through MOSFET 750 and consequently through MOSFET 755 of SSAD 720.

MOSFETs 755 and 760 are also configured in a current-mirror arrangement and consequently current 794 ($I_{out}$) flowing out of the drain of MOSFET 760 is also equal to $I_{out*}$.

SSAD 720 also includes MOSFETs 765 and 770, sample switch 798, evaluation switches 775 and 780, capacitor 785, reference current source 791, and discriminator 790.

When a discovery command is issued by the master, the slave may enter into detection mode or sampling phase. In this mode, sample switch 798 is closed, while evaluation switches 775 and 780 are open. In this configuration, a gate-to-source voltage ($V_{gs}$) is established for MOSFETs 765 and 770 and across capacitor 785. $V_{gs}$ for MOSFET 765 corresponds to the current flow through MOSFET 765 equal to $I_{out}$.

During the sampling phase, $I_{out}$ is representative of the quiescent current on the bus ($I_{load}$ under bus-idle conditions, i.e., $G_m*I_q$). Before an evaluation phase, switch 798 is opened, holding the voltage from gate to source of MOSFET 765 and effectively fixing the amount of current running from drain to source of MOSFET 765.

Next, during the evaluation phase, switches 775 and 780 are closed. Because MOSFET 770 is in a current-mirror configuration with MOSFET 765, the current flowing from drain to source of MOSFET 770 will be proportional to that flowing through MOSFET 765 (i.e., it is representative of the quiescent-state value of $I_{load}$) but at a ratio that is determined by the relative gain of MOSFET 770 vs. MOSFET 765, identified here as $G_d$. In one embodiment, $G_d$ is typically set to about 0.16, although it may be determined by optimizing the correction of the transconductance gain $G_m$-induced non-linearities over the expected load currents for the system.

Shortly after the system enters the evaluation mode, $I_{out}$ starts increasing by the amount of current drawn by downstream slaves as they start to reply to the DM command on the bus. This current will be ramping up above the value of $I_{out}$ sampled and held by MOSFET 765 (representative of $I_q$) and will trend toward $I_q+2*I_{RESP}$ as downstream slaves start to reply and all but one cancel their reply (when they detect slaves further downstream from them replying and recognize they are not the last active slave as described earlier). The one slave that determines it is to reply will continue ramping its output current toward $2*I_{RESP}$, and, as a result, $I_{load}$ will increment by that value, and $I_{out}$ will scale proportionally.

Letting $I_{samp}$ represent the current latched by MOSFET 765, and $I_{step}$ represent the incremental current rise in $I_{out}$ above $I_{samp}$ (as $I_{load}$ tends toward $I_q+2*I_{RESP}$), one can see that current flows into capacitor 785 equal to the present value of $I_{out}$ minus (a) $I_{samp}$ (which is subtracted away by MOSFET 765), (b) $G_d*I_{samp}$ (which is subtracted away by MOSFET 770), and (c) $I_{ref}$ which is flowing through current source 791. Thus, the current into capacitor 785 (herein "$I_c$") can be expressed as:

$$I_c = I_{out} - I_{samp} - G_d*I_{samp} - I_{ref}, \text{ and} \quad (1)$$

$$I_c = (I_{samp} + I_{step}) - I_{samp} - G_d*I_{samp} - I_{ref} \quad (2)$$

$$I_c = I_{step} - G_d*I_{samp} - I_{ref} \quad (3)$$

If $G_{dist}$ represents the actual distortion introduced by the non-linearity in the transconductance circuit, $I_c$ can be expressed as:

$$I_c = (G_m*I_{step} + G_{dist}*I_{samp}) - G_d*I_{samp} - I_{ref} \quad (4)$$

$$I_c = I_{samp}*(G_{dist} - G_d) + G_m*I_{step} - I_{ref} \quad (5)$$

If $G_{dist}$ is approximately equal to $G_d$, then $$I_c = G_m*I_{step} - I_{ref} \quad (6)$$

Thus, the detector compares $G_m*I_{step}$ with $I_{ref}$ to determine if a downstream slave is present. It can be appreciated that $I_{samp}*G_{dist}$ can cause incorrect comparison and hence have a negative impact on the reliability of the detection process and thus its elimination is beneficial to the detection process.

The portion of circuit 720 contributing this compensation factor is identified by the oval 788 in the diagram. The compensation factor has been shown to improve threshold detection by 28%. In practice, the relative gain between MOSFET 765 and MOSFET 770 can be controlled by the selection of the relative sizes (e.g., W/L) of the transistors.

Figures 8A, 8B:
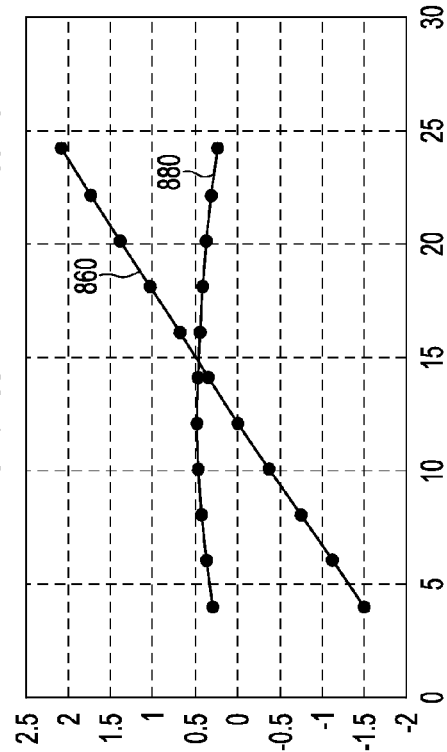
FIG. 8A is a table of values associated with the detection circuit of FIG. 7
FIG. 8B is a graph of values associated with the detection circuit of FIG. 7, according to an embodiment of the present invention.

FIG. 8A illustrates typical values associated with one possible embodiment of detector circuit 700 of FIG. 7, and FIG. 8B illustrates a corresponding plot of compensated and uncompensated results. FIG. 8A depicts a table of current values where the first column 810 represents the varying value of quiescent current downstream of slave 220(1) corresponding to differing numbers of downstream slaves. It varies from 4 mA to 24 mA. The second column 820 represents the incremental fixed reply value of $I_{RESP}$=12 mA from a given one of the downstream slaves. Columns 830 and 840 represent the current into the threshold detection capacitor of the system (e.g., capacitor 785 of FIG. 7) without compensation and with compensation, respectively. As can be seen by rearranging Equations (5) and (6) above, $$I_c + I_{ref} = I_{samp}*(G_{dist} - G_d) + G_m*I_{step} \text{(uncompensated)} \quad (7)$$

$$I_c + I_{ref} = G_m*I_{step} \text{(compensated)} \quad (8)$$

FIG. 8B shows that, without compensation (860), when a downstream slave is signaling, even when its reply signal is fixed at 12 mA, depending on the quiescent current, the $I_{RESP}$ detection crossing point varies from −1.5 to 2.0 mA, whereas with compensation (880), the threshold crossing point is much more tightly held at roughly +/−0.12 mA.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A load current detection circuit for detecting a load current on a bus, the detection comprising:
   a transconductance circuit that converts a voltage across a sense resistor carrying the load current into an output current;
   a sample-and-hold circuit that samples the output current during a quiescent phase of the bus to produce a sample current, wherein the sample-and-hold circuit includes a first transistor with a first W/L dimension, wherein the first transistor is used to sample and hold the output current during the quiescent phase of the bus;
   a distortion-compensating circuit with a gain, for producing a compensation current that is a function of the sample current, wherein the distortion-compensating circuit includes a second transistor with a second W/L dimension different from the first W/L dimension, and a gate of the first transistor is connected to a gate of the second transistor in a current-mirror configuration;
   a combining circuit that combines the output current, the sample current, the compensation current, and a reference current representative of a threshold value for the load current to produce a combined current; and
   a discriminator, connected to the combining circuit, that generates a discriminator output having a first value when the combined current exceeds the threshold value and a second value, different from the first value, when the combined current is less than the threshold value.

2. The load current detection circuit of claim 1, wherein the apparatus is part of a monitoring and/or control device attached to the bus.

3. The load current detection circuit of claim 1, wherein the bus is a Distributed Systems Interface Version 3 (DSI3) compatible bus and the threshold value is representative of the $I_{RESP}$ value of the DSI3 protocol.

4. The load current detection circuit of claim 1, wherein the compensation current is equal to the gain of the distortion-compensating circuit multiplied by the sample current.

5. The load current detection circuit of claim 1, wherein the gain of the distortion-compensation circuit is between unity and 1/100.

6. The load current detection circuit of claim 1, wherein:
the discriminator output is operatively connected to a monitoring and/or control device that is attached to the bus; and
the monitoring and/or control device generates a reply on the bus as a function of the discriminator output.

7. A method for threshold detection of a load current on a bus, the method comprising:
generating an output current representative of the load current on the bus using a transconductance circuit;
sampling the output current during a quiescent phase of the bus to produce a sample current, wherein the sampling is performed by a sample-and-hold circuit that includes a first transistor with a first W/L dimension that is used to sample and hold the output current during the quiescent phase of the bus;
generating a compensation current that is proportional to a transconductance gain associated with the transconductance circuit, wherein the compensation current is a function of the sampled current, and wherein the compensation current is generated by a distortion-compensating circuit that includes a second transistor with a second W/L dimension that is different from the first W/L dimension, and a gate of the first transistor is connected to a gate of the second transistor in a current-mirror configuration;
combining the output current, the sample current, the compensation current, and a reference current representative of a threshold value for the load current to produce a combined current; and
using a discriminator during an active phase of the bus to generate a discriminator output having a first value when the combined current, received from the combining circuit, exceeds the threshold value and a second value when the combined current is less than the threshold value.

8. The method of claim 7, wherein the method is exercised by a monitoring and control device attached to the bus.

9. The method of claim 7, wherein the bus is a Distributed Systems Interface Version 3 (DSI3) compatible bus and the threshold value is representative of the $I_{RESP}$ value of the DSI3 protocol.

10. The method of claim 7, wherein the transconductance circuit comprises a differential pair of transistors.

11. The method of claim 7, wherein the compensation current is generated using a distortion-compensating circuit, and the compensation current is equal to the gain of the distortion-compensating circuit multiplied by the sample current.

12. The method of claim 7, wherein the compensation current is generated using a distortion-compensating circuit, and the gain of the distortion-compensation circuit is between unity and 1/100.

13. The method of claim 7, wherein:
the discriminator output is operatively connected to a monitoring and control device that is attached to the bus; and
the monitoring and control device generates a reply on the bus as a function of the discriminator output.

* * * * *